(12) United States Patent
Sakurai

(10) Patent No.: US 12,040,549 B2
(45) Date of Patent: Jul. 16, 2024

(54) ANTENNA MODULE

(71) Applicant: KYOCERA Corporation, Kyoto (JP)

(72) Inventor: Keizou Sakurai, Kyoto (JP)

(73) Assignee: KYOCERA Corporation, Kyoto (JP)

( * ) Notice: Subject to any disclaimer, the term of this patent is extended or adjusted under 35 U.S.C. 154(b) by 162 days.

(21) Appl. No.: 17/779,821

(22) PCT Filed: Oct. 6, 2020

(86) PCT No.: PCT/JP2020/037871
§ 371 (c)(1),
(2) Date: May 25, 2022

(87) PCT Pub. No.: WO2021/106377
PCT Pub. Date: Jun. 3, 2021

(65) Prior Publication Data
US 2023/0006361 A1 Jan. 5, 2023

(30) Foreign Application Priority Data
Nov. 26, 2019 (JP) .................. 2019-213220

(51) Int. Cl.
*H01Q 21/06* (2006.01)
*H01Q 1/52* (2006.01)
*H01Q 13/08* (2006.01)

(52) U.S. Cl.
CPC .......... *H01Q 21/065* (2013.01); *H01Q 1/523* (2013.01); *H01Q 1/526* (2013.01); *H01Q 13/08* (2013.01)

(58) Field of Classification Search
CPC ......... H01Q 21/065; H01Q 1/523–526; H01Q 1/243; H01Q 21/0025
USPC ........................................... 343/702
See application file for complete search history.

(56) References Cited

U.S. PATENT DOCUMENTS 10,700,440 B1 * 6/2020 Taveniku ............. H01Q 9/0414

FOREIGN PATENT DOCUMENTS

| JP | 2003309483 A | * | 10/2003 | |
|---|---|---|---|---|
| JP | 2005086603 A | * | 3/2005 | ........... H01L 23/552 |

* cited by examiner

*Primary Examiner* — Hoang V Nguyen
*Assistant Examiner* — Brandon Sean Woods
(74) *Attorney, Agent, or Firm* — Volpe Koenig

(57) ABSTRACT

An antenna module includes a control board having a control circuit, an antenna board on the control board and having a shield through hole and a plurality of first antenna patch conductors, a signal conductor on the control board and the antenna board, a frame body surrounding the first antenna patch conductors and separating the first antenna patch conductors from each other, a metal film covering at least an outer surface or an inner surface of the frame body, and a filter electrically connected to the shield through hole. The control or antenna board includes an internal antenna opposing the first antenna patch conductors. When seen in a plan view, the shield through hole is located between the first antenna patch conductors. A resin having a higher dielectric constant than air is located is surrounded by the frame body such that the first antenna patch conductors are coated with resin.

8 Claims, 2 Drawing Sheets

ANTENNA MODULE

TECHNICAL FIELD

The present invention relates to an antenna module.

BACKGROUND ART

A communication device using a wireless network includes an antenna module as described in Patent Document 1, for example, for transmission and reception of electrical signals.

CITATION LIST

Patent Literature

Patent Document 1: JP 2003-309483A

SUMMARY

An antenna module according to the present disclosure includes a control board having a control circuit, an antenna board mounted on the control board and having a shield through hole and a plurality of first antenna patch conductors arranged side by side when seen in a plan view, a signal conductor located in the control board and the antenna board, a frame body surrounding the first antenna patch conductors on the antenna board and separating the first antenna patch conductors from each other, a metal film covering at least an outer surface or an inner surface of the frame body, and a filter that is electrically connected to the shield through hole. The control board or the antenna board includes an internal antenna disposed at a position opposing the first antenna patch conductors. When seen in a plan view, the shield through hole is located between the first antenna patch conductors that are adjacent to each other. A resin having a higher dielectric constant than air is located in a region surrounded by the frame body such that the first antenna patch conductors are coated with the resin.

DESCRIPTION OF EMBODIMENTS

Figure 1A:
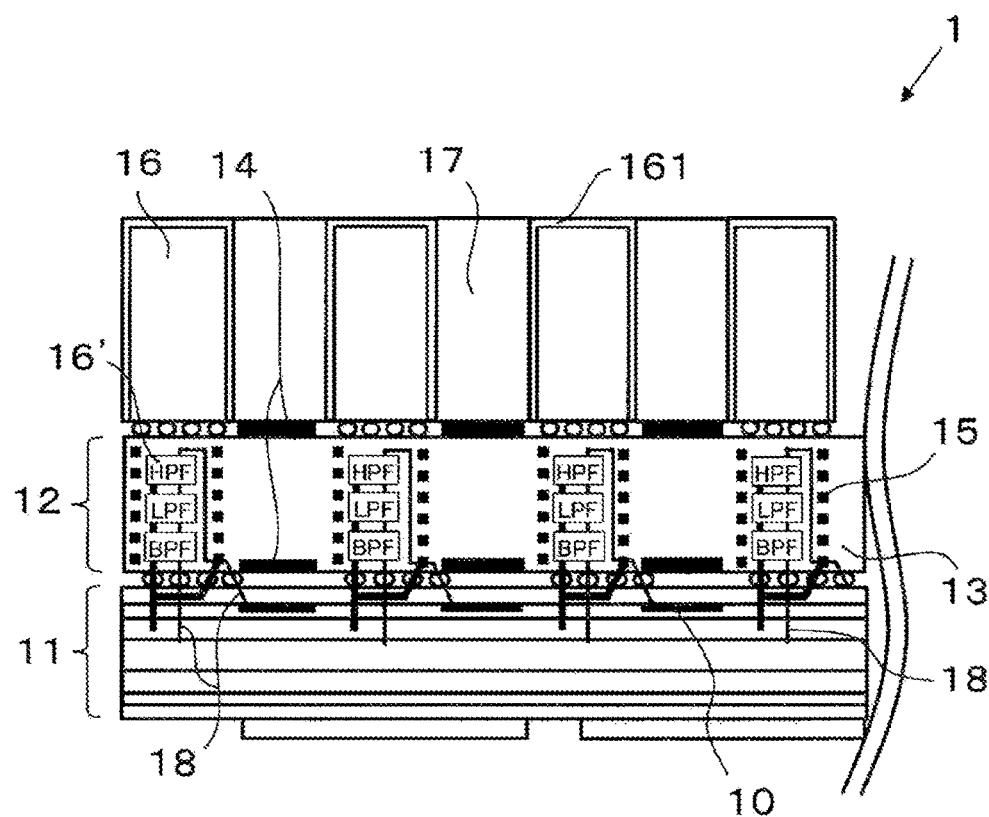
In FIG. 1A is a schematic cross-sectional view illustrating an antenna module according to an embodiment of the present disclosure.

As described in Patent Document 1, an antenna module includes a filtering substrate for separating electrical signals in a required frequency band from electrical signals in an unwanted frequency band. However, conventional antenna modules have problems such as insufficient removal of out-of-band electromagnetic waves, which often causes noise and multiple reflections, resulting in deterioration of transmission performance.

As described above, the antenna module according to the present disclosure includes a frame body in which a metal film covers at least the outer surface or the inner surface of the frame body. Furthermore, a resin having a higher dielectric constant than air is located in a region surrounded by the frame body such that the first antenna patch conductors are coated with the resin. Therefore, the frame body coated with the metal film functions as a waveguide. The presence of the resin having a higher dielectric constant than air shortens the wavelength of the electromagnetic waves passing through the waveguide and reduces the waveguide height. This provides a compact antenna module that can easily attenuate out-of-band electromagnetic waves and reduce noise generation.

The antenna module according to an embodiment of the present disclosure will be described below with reference to FIGS. 1A-1B. The antenna module 1 according to the embodiment includes a control board 11, an antenna board 12, and a frame body 16.

The control board 11 includes a control circuit that functions to control the strength of the electromagnetic waves or the timing of transmission and reception of the electromagnetic waves. Although illustrated in a simplified manner in FIGS. 1A to 1B, the control board 11 has, for example, a build-up structure in which the insulating layer and the wiring conductor layer are alternately stacked.

The insulating layer may be made of any material having an insulating property. Examples of the material having an insulating property include resins such as an epoxy resin, a bismaleimide-triazine resin, a polyimide resin, and a polyphenylene ether resin. Two or more of these resins may be mixed and used.

The insulating layer may contain a reinforcing material. Examples of the reinforcing material include insulating fabric materials such as glass fiber, glass non-woven fabric, aramid non-woven fabric, aramid fiber, and polyester fiber. Two or more types of reinforcing materials may be used in combination. In addition, inorganic insulating fillers made of, for example, silica, barium sulfate, talc, clay, glass, calcium carbonate, or titanium oxide may be dispersed in the insulating layer.

The wiring conductor layer may be made of any material having electrical conductivity. Examples of a material having electrical conductivity include metals such as copper. Specifically, the wiring conductor layer is made of a metal foil such as a copper foil or formed by metal plating such as copper plating. Furthermore, the control board 11 includes an internal antenna 10. Providing the internal antenna 10 in the control board 11 can increase the bandwidth of the electromagnetic waves used.

The antenna board 12 is located on the surface of the control board 11 and is electrically connected to the control board 11. The antenna board 12 includes an insulating plate 13, antenna patch conductors 14, a shield through hole 15, a filter 16', and a signal conductor 18.

The insulating plate 13 may be made of any material having an insulating property. Examples of a material having an insulating property include fluororesin, liquid crystal polymer, and other resins mentioned above. The insulating plate 13 may also contain the reinforcing material described above, or an inorganic insulating filler may be dispersed in the insulating plate 13, as necessary.

The antenna patch conductors 14 are provided to receive electromagnetic waves. When the antenna board 12 is viewed in a plan view, a plurality of antenna patch conductors 14 are arranged in a matrix manner. Typically, the antenna patch conductors 14 are aligned at equal intervals.

In the antenna board 12, the antenna patch conductor 14 is provided at both upper and lower surfaces of the insulating plate 13 at opposing positions. For convenience, the antenna patch conductor 14 provided on the upper surface of the insulating plate 13 is referred to as a "first antenna patch conductor", and the antenna patch conductor 14 provided on the lower surface of the insulating plate 13 is referred to as a "second antenna patch conductor" in the present specification. The antenna patch conductor 14 may be made of any material having an insulating property. Such a material is, for example, a metal such as copper, as in the wiring conductor layer described above.

When the antenna board 12 is seen in a plan view, the shield through hole 15 is located between the antenna patch conductors 14 that are adjacent to each other. The shield through hole 15 is a ground through hole which functions to prevent the influence of the electromagnetic waves on the filter circuit as well as the influence of the electromagnetic waves from the filter circuit on the electromagnetic waves for transmission and reception.

The shield through hole 15 is located along the circumference of the antenna patch conductor 14. In FIGS. 1A to 1B, the shield through hole 15 is illustrated along only two sides of the antenna patch conductor 14. However, in practice, the shield through hole 15 is also present along the remaining two sides. The shield through hole 15 is made of a metal such as copper, for example.

Figure 1B:
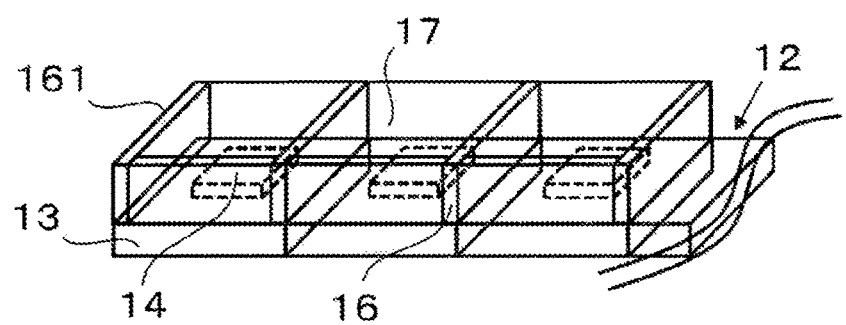
FIG. 1B is a schematic view illustrating an antenna board provided in the antenna module according to the embodiment of the present disclosure.

As illustrated in FIGS. 1A to 1B, the signal conductor 18 electrically connects the wiring conductor layer of the control board 11 to the internal antenna 10. The signal conductor 18 passes through the filter 16' between the wiring conductor layer of the control board 11 and the internal antenna 10.

In the antenna board 12, the filter 16' is embedded in the antenna board 12 (insulating plate 13) and is sandwiched between the shield through holes 15 (the antenna patch conductors 14). The filter 16' has a function of separating the electromagnetic waves of the required frequency band from the electromagnetic waves of an 'unwanted frequency band among the electromagnetic waves received by the antenna patch conductors 14 or the electromagnetic waves emitted from the antenna patch conductors 14.

The filter 16' includes, for example, a high-pass filter (HPF) and a low-pass filter (LPF). By providing the HPF and the LPF, the electromagnetic waves in the high-frequency band and the electromagnetic waves in the low-frequency band can be removed. The filter 16' illustrated in FIGS. 1A to 1B also includes a bandpass filter (bandpass filter: BPF) in addition to the HPF and the LPF.

For example, in the antenna module 1 according to the embodiment, the electromagnetic waves received by the antenna patch conductor 14 (first antenna patch conductor) are transmitted to the internal antenna 10 provided in the control board 11 via the antenna patch conductor 14 (second antenna patch conductor) provided at a position facing the first antenna patch conductor. Subsequently, the electromagnetic waves having reached the internal antenna 10 are transmitted through the signal conductor 18 to the filter 16'. The electromagnetic waves transmitted to the filter 16' are divided into the electromagnetic waves of the required frequency band and the electromagnetic waves of the unwanted frequency band. The electromagnetic waves of the required frequency band are transmitted to the control circuit through the signal conductor 18 provided in the control board 11. On the other hand, the electromagnetic waves of the unwanted frequency band are transmitted to the ground layer formed in the control board 11, for example, and emitted to the outside of the antenna module 1.

The electromagnetic waves transmitted from the control board 11 are transmitted through the signal conductor 18 to the filter 16'. The electromagnetic waves transmitted to the filter 16' are divided into the electromagnetic waves of the required frequency band and the electromagnetic waves of the unwanted frequency band. The electromagnetic waves of the required frequency band are transmitted through the signal conductor 18 to the internal antenna 10 provided in the control board 11. On the other hand, the electromagnetic waves of the unwanted frequency band are transmitted to the ground layer formed in the control board 11, for example, and emitted to the outside of the antenna module 1. Subsequently, the electromagnetic waves transmitted to the internal antenna 10 are then transmitted to the antenna patch conductor 14 (first antenna patch conductor) via the antenna patch conductor 14 (second antenna patch conductor). The electromagnetic waves are, then, emitted externally via the frame body 16 which functions as a waveguide, which will be described later.

In the antenna module 1 according to the embodiment, the filter 16' is embedded in the antenna board 12. The antenna module 1, therefore, does not include another substrate including the filter 16'. This prevents the multi-layered structure of the antenna module 1 according to the embodiment, so that the antenna module 1 has a simple structure which contributes to size reduction of the communication device.

As illustrated in FIGS. 1A to 1B, the frame body 16 is disposed on the antenna board 12 surrounding the antenna patch conductors 14 (first antenna patch conductors) and separating the antenna patch conductors 14 from each other. At least the outer surface or the inner surface of the frame body 16 is coated with a metal film 161. This allows the frame body 16 to function as a waveguide. Thus, it is easier to attenuate the electromagnetic waves of the unwanted frequency band.

Furthermore, in the antenna module 1 according to the embodiment, a resin 17 having a higher dielectric constant than air is located in the region surrounded by the frame body 16 so as to cover the first antenna patch conductor 14. That is, the resin 17 is located on the antenna board 12 surrounded by the frame body 16 and on the first antenna patch conductor 14.

In order for the frame body 16 coated with the metal film 161 to function as a waveguide, the height of the frame body 16 is set to a length equivalent to one wavelength that the electromagnetic waves applied to the module have in air. That is, the height is set to the length equivalent to one wavelength of the frequency of the electromagnetic waves in the air transmitted through the signal conductor 18. At this time, the use of the resin 17 having a higher dielectric constant than air makes the wavelength of electromagnetic waves passing through the waveguide be shortened as expressed by the equation below. Thus, the height of the frame body 16 can be shorter than the length of the one wavelength of the electromagnetic waves in the air. As a result, it is possible to decrease the height of the frame body 16 (waveguide), and this can contribute to the size reduction of the antenna module 1. Keeping the height of the frame body 16, the height of the metal film 161, and the height of the resin 17 the same is advantageous in that it facilitates reduction of the height of the frame body 16 (waveguide).

Wavelength ($\lambda$) of electromagnetic waves in resin=wavelength in air ($\lambda 0$)/$\sqrt{}$(dielectric constant of resin)

The resin 17 having a higher dielectric constant than air may be made of any resin having a higher dielectric constant than air, such as an epoxy resin, a fluorine resin, a polyimide resin, or the like.

The material of the frame body 16 is not particularly limited. Examples of the material of the frame body 16 having an insulating property include resins such as an epoxy resin, a bismaleimide-triazine resin, a polyimide resin, a polyphenylene ether resin, a fluorine-based resin, a liquid crystal polymer, or another resin. Two or more of these resins may be mixed and used.

Examples of the metal film 161 include a film of copper, gold, aluminum, or the like. The metal film 161 is formed by any method, and the metal film 161 may be formed by, for example, plating, or by bonding a metal foil. Furthermore, the upper end surface of the frame body 16 may be coated with the metal film 161. In a case where gold is used as the metal film 161, the formation of the oxide film can be reduced, which is advantageous for transmission of the electromagnetic waves. As used herein, the outer surface of the frame body 16 means a surface that does not face the antenna patch conductor 14, that is, the outer peripheral surface of the frame body 16. The inner surface of the frame body 16 refers to surfaces facing the antenna patch conductor 14 surrounded by the frame body 16. That is, the inner surface refers to four surfaces surrounding the antenna patch conductor 14.

As described above, the antenna module according to the present disclosure includes the frame body 16 having at least the outer surface or the inner surface coated with the metal film 161, as described above. Furthermore, the resin 17 having a higher dielectric constant than air is located in the region surrounded by the frame body 16 so as to cover the first antenna patch conductor 14. The frame body 16 coated with the metal film 161, therefore, functions as a waveguide, facilitating attenuation of the out-of-band electromagnetic waves and reducing the occurrence of noise. This allows transmission and reception of specific electromagnetic waves preferentially. Since the height of the frame body 16 (waveguide) can be reduced, the antenna module 1 can be reduced in size. Furthermore, the presence of the frame body 16 enables reduction of the warpage and deformation of the antenna module 1 due to a difference in the coefficient of thermal expansion between the control board 11 and the antenna board 12.

Figure 2:
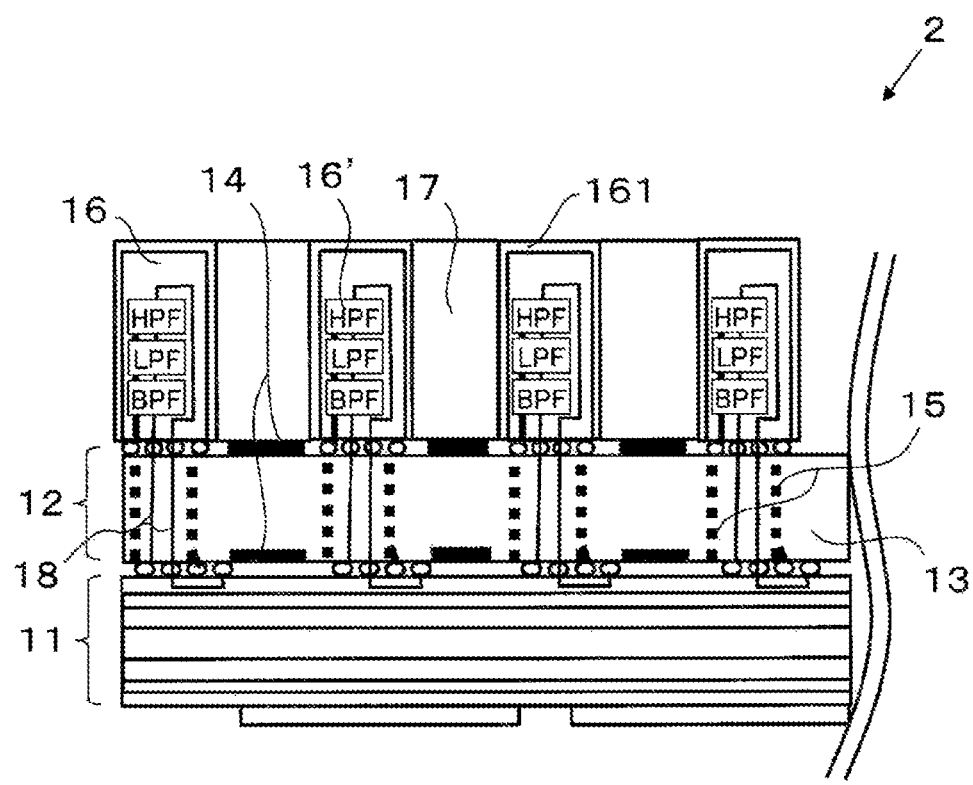
FIG. 2 is a schematic cross-sectional view illustrating an antenna module according to another embodiment of the present disclosure.

The present disclosure is not limited to the antenna module 1 according to the above-described embodiment, and various modifications can be made without departing from the scope of the present disclosure. In FIGS. 1A to 1B, the filter 16' is built into the antenna board 12. However, like an antenna module 2 according to another embodiment illustrated in FIG. 2, the filter 16' may be built into the frame body 16. The members described in connection with the antenna module 1 according to the above-described embodiment are denoted by the same reference numerals in FIG. 2, and detailed description of each member is omitted.

In this case, it is easier to secure the storage area for the filter 16' in the frame body 16 than in the case of the antenna board 12 having many wires. This is advantageous in improving freedom of design and for size reduction of the antenna board 12.

Figure 3:
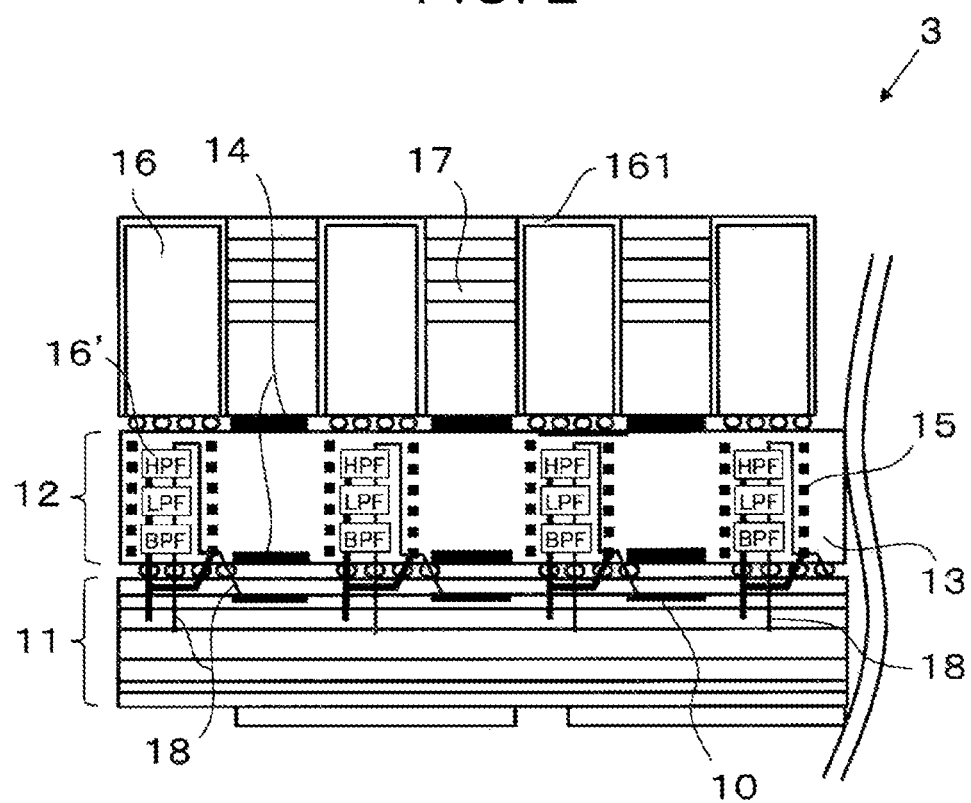
FIG. 3 is a schematic cross-sectional view illustrating an antenna module according to still another embodiment of the present disclosure.

The resin 17 having a higher dielectric constant than air may be used alone, or two or more types of resins 17 having different dielectric constants may be used in combination. When two or more resins 17 having different dielectric constants are used in combination, for example, the resins are packed in layers as in an antenna module 3 according to still another embodiment illustrated in FIG. 3. Specifically, the resins should be packed in layers so that the resin 17 with a higher dielectric constant is placed closer to the antenna patch conductor 14 (first antenna patch conductor). The members described in the antenna module 1 according to the above-described embodiment are denoted by the same reference numerals in FIG. 3, and detailed description of each member is omitted.

To stack the resins in layers, a layer of the resin with the highest dielectric constant of the resins 17 to be used is formed first in a region surrounded by the frame body 16. Next, a layer of the resin having the second highest dielectric constant is formed on the surface of the layer of the resin having the highest dielectric constant. In this way, the layers of resins are formed until the desired number of layers is achieved, so that the layer of resin located at the outermost surface is formed with the resin having the lowest dielectric constant.

The number of layers may be at least two layers, and may be four or more layers. Considering the effect of reducing multiple reflections and the complexity of the manufacturing process, the number of layers should be about 10 to 20 at most. The thickness of each layer is not limited, and all layers may have the same thickness, and at least some layers may have different thicknesses. For example, the layer of the resin 17 having the highest dielectric constant may be formed to be the thickest. In that case, the thickness of the layer of the resin 17 having the highest dielectric constant is preferably approximately from 5% to 70% of the total thickness of the resins 17. In this manner, multiple reflections can further be reduced by layering two or more types of resins having different dielectric constants in a layered manner.

In the antenna module 1 according to the above-described embodiment, the internal antenna 10 is provided in the control board 11. Alternatively, the internal antenna 10 may be provided in the antenna board 12. In that case, only the first antenna patch conductor 14 described above is provided as the antenna patch conductor 14, and the internal antenna 10 is provided in place of the second antenna patch conductor 14. This is advantageous in that the structure of the control board 11 can be simplified.

Furthermore, the antenna module 1 of the present disclosure may include a metal frame (stiffener) on the lower surface of the control board to reduce the warpage. Examples of the metal frame include a frame made of, for example, copper, Alloy 42, cobalt, stainless steel, or aluminum.

REFERENCE SIGNS LIST

1 Antenna module
10 Internal antenna
11 Control board
12 Antenna board
13 Insulating plate
14 Antenna patch conductor
15 Shield through hole
16 Frame body
16' Filter
161 Metal film
17 Resin
18 Signal conductor

The invention claimed is:

1. An antenna module, comprising:
   a control board having a control circuit;
   an antenna board mounted on the control board and having a plurality of shield through holes and a plurality of first antenna patch conductors arranged side by side when seen in a plan view;
   a signal conductor located in the control board and the antenna board;
   a plurality of frame bodies, wherein each frame body of the plurality of frame bodies surrounds an antenna patch conductor of the plurality of first antenna patch conductors on the antenna board and separates the first antenna patch conductors from each other;
   a metal film covering at least an outer surface or an inner surface of a frame body of the plurality of frame bodies; and
   a plurality of filters that are electrically connected to the signal conductor and the plurality of shield through holes, wherein
   the control board or the antenna board comprises a plurality of internal antennas disposed at a position opposing the respective first antenna patch conductors of the plurality of first antenna patch conductors,
   when seen in a plan view, the plurality of shield through holes are located between the first patch antenna conductors that are adjacent to each other, and
   a resin having a higher dielectric constant than air is located in a region surrounded by the plurality of frame bodies to cover the plurality of first antenna patch conductors with the resin.

2. The antenna module of claim 1, wherein the plurality of filters are built into the antenna body.

3. The antenna module of claim 1, wherein the plurality of filters are built into a corresponding frame body of the plurality of frame bodies.

4. The antenna module according to claim 1, wherein a height of the plurality of frame bodies is shorter than a length equivalent to one wavelength of a frequency of electromagnetic waves in air transmitted through the signal conductor.

5. The antenna module according to claim 1, wherein
   the resin comprises a plurality of layers having different dielectric constants disposed in order from the first antenna patch conductor side, and
   the plurality of layers comprise at least a first layer and a second layer positioned closer to the first antenna patch conductor than the first layer, and
   the dielectric constant of the second layer is higher than the dielectric constant of the first layer.

6. The antenna module according to claim 1, wherein a height of the plurality of frame bodies, a height of the metal film, and a height of the resin are identical.

7. The antenna module according to claim 1, wherein the metal film is made of gold.

8. The antenna module according to claim 1, wherein the plurality of internal antennas are located in the control board, and the antenna board further comprises a plurality of second antenna patch conductors each disposed at a position opposing a corresponding one of the first antenna patch conductors.

* * * * *